United States Patent
Kato

(10) Patent No.: US 7,812,781 B2
(45) Date of Patent: Oct. 12, 2010

(54) MATCHING DEVICE AND ANTENNA MATCHING CIRCUIT

(75) Inventor: Akira Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 76 days.

(21) Appl. No.: 12/205,149

(22) Filed: Sep. 5, 2008

(65) Prior Publication Data

US 2009/0002255 A1 Jan. 1, 2009

Related U.S. Application Data

(63) Continuation of application No. PCT/JP2007/058265, filed on Apr. 16, 2007.

(30) Foreign Application Priority Data

May 19, 2006 (JP) ............... 2006-140274

(51) Int. Cl.
*H01Q 1/50* (2006.01)
(52) U.S. Cl. ...................... 343/860; 343/850
(58) Field of Classification Search ................. 343/850, 343/860, 861
See application file for complete search history.

(56) References Cited

U.S. PATENT DOCUMENTS

| | | | | |
|---|---|---|---|---|
| 2,773,121 A | * | 12/1956 | Janssen | 348/685 |
| 2,775,714 A | * | 12/1956 | Curtis | 327/70 |
| 3,095,533 A | * | 6/1963 | Keizer | 363/34 |
| 5,557,290 A | * | 9/1996 | Watanabe | 343/713 |
| 6,049,310 A | * | 4/2000 | Sadahiro | 343/702 |
| 6,862,432 B1 | * | 3/2005 | Kim | 455/80 |
| 6,940,467 B2 | * | 9/2005 | Fischer et al. | 343/850 |
| 2006/0022763 A1 | | 2/2006 | Kato | |
| 2009/0245425 A1 | * | 10/2009 | Tsutsui et al. | 375/319 |

FOREIGN PATENT DOCUMENTS

| | | |
|---|---|---|
| JP | 63-176011 | 7/1988 |
| JP | 1-240009 | 9/1989 |
| JP | 7-303019 | 11/1995 |
| JP | 8-051380 | 2/1996 |
| JP | 11-17580 | 1/1999 |
| JP | 2000-151281 | 5/2000 |
| JP | 10-336055 | 12/2008 |
| WO | 2005020427 | 3/2005 |

OTHER PUBLICATIONS

International Search Report issued Jul. 24, 2007 with English Language translation.
English Language translation of Written Opinion issued Jul. 24, 2007.

* cited by examiner

*Primary Examiner*—Tho G Phan
(74) *Attorney, Agent, or Firm*—Keating & Bennett, LLP

(57) ABSTRACT

A battery portion (BAT) or another type of voltage shift portion is provided for shifting a control voltage (V2) in a direction which causes the anode potential of a variable-capacitance diode (VD) to be a negative potential and superimposes its battery voltage (Vb) on the control voltage (V2). Specifically, the battery portion (BAT) is inserted in a direction which causes the control voltage (V2) to be decreased and operates such that [control voltage (V2)–battery voltage (Vb)] is applied to the anode terminal of the variable-capacitance diode (VD). Then, the voltage applied to the variable-capacitance diode (VD) is [control voltage (V2)–control voltage (V1)–battery voltage (Vb)]. Thus, the variable capacitance range of the variable-capacitance diode (VD) is increased.

10 Claims, 4 Drawing Sheets

MATCHING DEVICE AND ANTENNA MATCHING CIRCUIT

CROSS-REFERENCE TO RELATED APPLICATIONS

This is a continuation under 35 U.S.C. §111(a) of PCT/JP2007/058265 filed Apr. 16, 2007, and claims priority of JP2006-140274 filed May 19, 2006, both incorporated by reference.

BACKGROUND

1. Technical Field

The present disclosure relates to matching devices for matching circuit impedances using variable-capacitance diodes, and antenna matching circuits using the matching devices. In particular, described is a technique for shifting a variation range of a voltage applied to a variable-capacitance diode to increase a variable capacitance range of the diode.

2. Background Art

In radio communication in general, to increase reception efficiency, impedance matching between an antenna and a receiving circuit is provided (impedance matching) in accordance with the reception frequency of a radio signal. In a scheme for performing such impedance matching, a matching device including a variable-capacitance diode is disposed between an antenna and a receiving circuit.

In addition, a variable-capacitance diode is also used in a tuning circuit for extracting only a reception frequency component from radio signals received by an antenna which contain a plurality of frequency components, so that a tuning frequency (resonant frequency) viewed from a receiving circuit is changed.

Variable-capacitance diodes are also called varicap diodes or varactor diodes, and generate capacitances in accordance with the widths of depletion layers produced therein. When applied with a control voltage which serves as a reverse bias voltage, the width of the depletion layer of a variable-capacitance diode changes, which as a result makes the capacitance variable.

For example, Japanese Unexamined Patent Application Publication No. H10-336055 (Patent Document 1) discloses an antenna tuning controller having an antenna including inductance elements and a variable tuning section for setting the resonant frequencies of the inductance elements in accordance with a control voltage, and a control means for supplying the control voltage to the antenna. In this variable tuning section, a serially connected fixed-capacitance element and variable-capacitance element are connected in parallel with the inductance elements.

In addition, Japanese Unexamined Patent Application Publication No. H11-017580 (Patent Document 2) discloses an antenna matching device provided with an antenna matching section having a variable-capacitance element, an operation section for performing adjustment processing in accordance with the frequency characteristic of the antenna matching section and adding a constant output from a constant generating section, and a D-A converter for performing analog conversion of output data from the operation section so as to output a control voltage for the variable-capacitance element.

Patent Document 1: Japanese Unexamined Patent Application Publication No. H10-336055

Patent Document 2: Japanese Unexamined Patent Application Publication No. H11-017580

As described above, in a variable-capacitance diode, the amount of capacitance, which varies in accordance with an applied reverse bias voltage, i.e., the variable capacitance range, depends on the variation range of a control voltage applied across the variable-capacitance diode.

On the other hand, in particular, in a mobile receiver (communication device) such as a compact radio set or a mobile phone, there has been a trend toward a low voltage of driving power (for example, as low as 1.8 V) used in a matching circuit, along with the recent trends toward high density and low power consumption of a semiconductor integrated circuit used in circuits in the mobile receiver. Along with these trends, the variation range of a control voltage which can be applied across a variable-capacitance diode is also decreased, which further limits the variable capacitance range.

The driving power may be boosted using a charge pump and a DC-DC converter. However, this may complicate the circuit configuration and increase the weight, and thus it is not realistically possible to employ such a scheme.

For the above reasons, there is a problem in that the variable capacitance range of a variable-capacitance diode is limited and the performance as a matching device is degraded.

SUMMARY

The present disclosure has a solution to the above problem. Disclosed are a matching device and an antenna matching circuit which increase the variable capacitance range of a variable-capacitance diode and provide circuit impedance matching over an increased range.

According to the present disclosure, a matching device comprises a variable-capacitance diode configured to change an impedance of a circuit including an external element, a first control signal line connected to a cathode terminal of the variable-capacitance diode, for applying a first control voltage, a second control signal line connected to an anode terminal of the variable-capacitance diode, for applying a second control voltage, and a voltage shift portion inserted in the second control signal line, for shifting the second control voltage so that the anode potential of the variable-capacitance diode becomes a negative potential.

According to the present disclosure, for the variable-capacitance diode, a potential difference between the control voltage to be applied to the cathode terminal and the control voltage to be applied to the anode terminal is generated as an applied voltage. Thus, by shifting the control voltage applied to the anode terminal so that the control voltage becomes a negative potential, the variation range of the voltage to be applied to the variable-capacitance diode can be substantially increased. As a result, the variable capacitance range of the variable-capacitance diode can also be increased.

The voltage shift portion may be composed of a chemical battery.

The matching device may further comprise a first rectifier circuit connected to the first control signal line, for rectifying a first alternating-current signal supplied to the first control signal line to generate the first control voltage and a second rectifier circuit connected to the second control signal line, for rectifying a second alternating-current signal supplied to the second control signal line to generate the second control voltage.

The voltage shift portion may be composed of a constant voltage diode which generates a constant voltage when applied with a reverse bias voltage, and the constant voltage diode is configured to be applied with a reverse bias voltage using the first alternating-current signal or the second alternating-current signal.

The voltage shift portion may be composed of a transformer configured to supply the second alternating-current signal to the second rectifier circuit after inverting the polarity of the second alternating-current signal.

Preferably, the first and second alternating-current signals are generated by pulse width modulation.

Further, according to the present disclosure, an antenna matching circuit comprises a matching device as described above and a voltage supply unit for supplying a voltage to be applied to the variable-capacitance diode, which is connected to the first and second control signal lines of the matching device, in which the external element is an antenna element.

According to the present disclosure, a matching device and an antenna matching circuit which increase the variable capacitance range of a variable-capacitance diode and can provide circuit impedance matching over an increased range can be realized.

Other features and advantages will become apparent from the following description of embodiments, which refers to the accompanying drawings.

DETAILED DESCRIPTION

Figure 1:
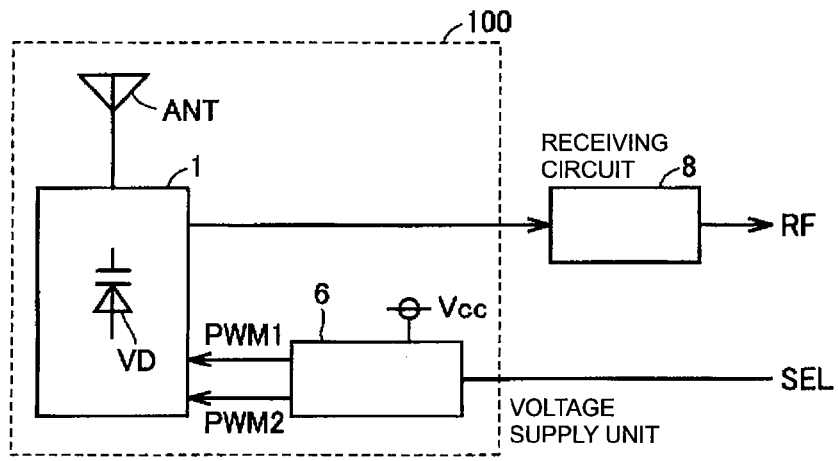
FIG. 1 is a diagram illustrating main components of a mobile receiver having a matching device according to Embodiment 1 of the present invention.

Reference Numerals 1, 3, 4 matching devices; 6 voltage supply unit; 8 receiving circuit; 100 antenna matching circuit; ANT antenna element; BAT battery portion, C1, C2, C3, C4, C5, C10, C11 capacitors; D2, D10, D11 diodes; L1, L2 inductors; LN1, LN2 control signal lines; LNA low-noise amplifier; LPF1, LPF2 rectifier circuits; PWM1, PWM2 pulse signals; R1, R2, R5, R6, R10, R11, R12, R20, R21 resistors; RF reception signal; SEL channel selection command; TR transformer; V1, V2 control voltages; Vb battery voltage; Vcc driving voltage; VD variable-capacitance diode; Vmax maximum voltage; Vzd Zener voltage; ZD Zener diode.

Embodiments of the present invention will be described in detail with reference to the drawings. Note that the same or corresponding components are designated by the same reference numerals and the descriptions thereof will not be repeated.

EMBODIMENT 1

A mobile receiver having a matching device 1 according to Embodiment 1 of the present invention is intended for reception of terrestrial digital broadcasting (so-called "one-segment broadcasting") for a mobile device, for example.

Referring to FIG. 1, a matching device 1 according to Embodiment 1 of the present invention is connected to an antenna element ANT and a voltage supply unit 6 so as to constitute an antenna matching circuit 100.

The antenna matching circuit 100 receives a channel selection command SEL from a channel selecting unit (not shown) or the like and changes the capacitance so as to provide matching of the circuit impedance viewed from the receiving circuit 8 in accordance with the reception frequency of a corresponding channel. Then, the antenna matching circuit 100 outputs a radio signal received by the antenna to the receiving circuit 8. The receiving circuit 8 amplifies the radio signal received from the antenna matching circuit 100 and outputs the signal as a reception signal RF. Then, the receiving circuit 8 outputs the restored reception signal RF to a mixer unit, a decoder unit, or the like (not shown).

The antenna matching circuit 100 has the voltage supply unit 6, the matching device 1 including a variable-capacitance diode VD, and the antenna element ANT.

The voltage supply unit 6 supplies a voltage to be applied to the variable-capacitance diode VD in response to the channel selection command SEL. In Embodiment 1 of the present invention, the voltage supply unit 6 supplies pulse signals PWM1 and PWM2 generated from a driving voltage Vcc by means of pulse width modulation (hereinafter also simply referred to as "PWM modulation"). Specifically, the voltage supply unit 6 changes an average voltage of the pulse signals PWM1 and PWM2 by changing the duty ratio of each of the signals, so as to change the capacitance of the variable-capacitance diode VD in accordance with the channel selection command SEL.

Then matching device 1 rectifies the pulse signals PWM1 and PWM2 supplied from the voltage supply unit 6 to generate first and second control voltages. The two respective control voltages are applied to the cathode terminal and anode terminal of the variable-capacitance diode VD. In accordance with a potential difference between the two control voltages applied in this way, the variable-capacitance diode VD changes the capacitance thereof and changes an output impedance of the matching circuit including the antenna element ANT, i.e., the circuit impedance viewed from the receiving circuit 8.

The variable-capacitance diode VD is also called a varicap diode or a varactor diode and generates a capacitance in accordance with the width of a depletion layer produced therein. When applied with a control voltage which serves as a reverse bias voltage, the width of the depletion layer of a variable-capacitance diode changes, which realizes a variable capacitance.

Figure 2:
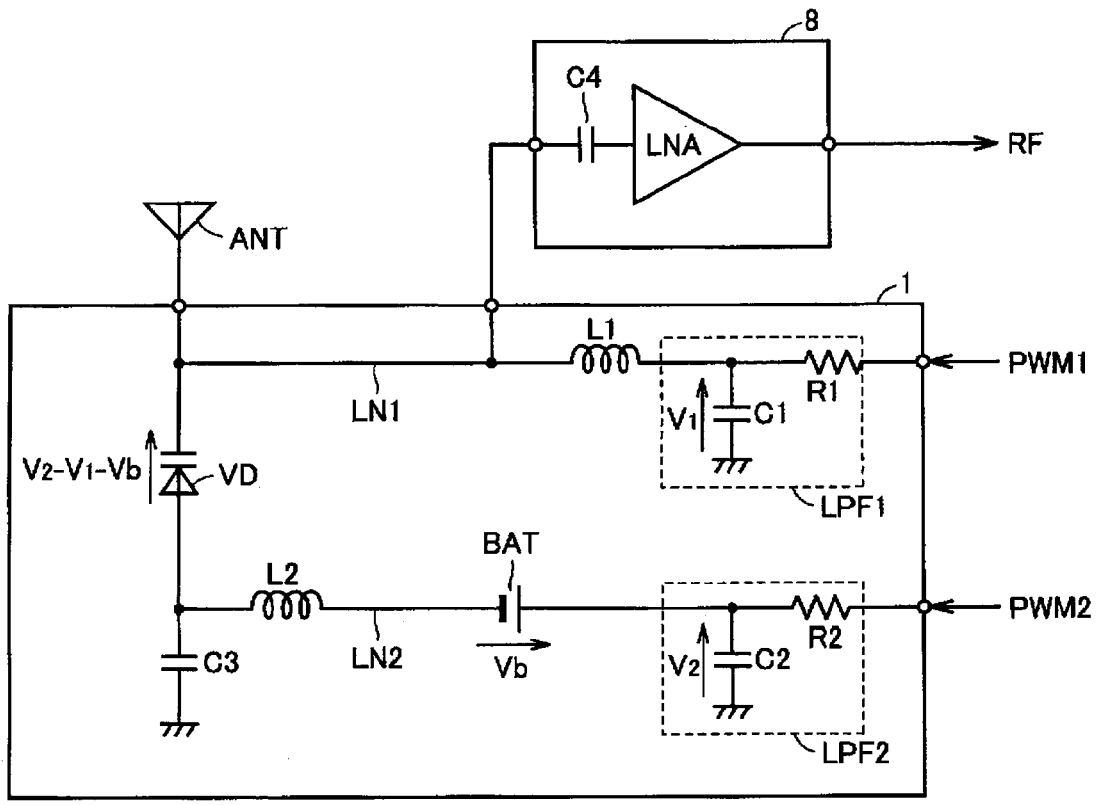
FIG. 2 is a circuit configuration diagram of a matching device, an antenna element, and a receiving circuit.

Referring to FIG. 2, in the matching device 1, connection parts for receiving the pulse signals PWM1 and PWM2 from the voltage supply unit 6 (FIG. 1) and connection parts for connection to the antennal element ANT and the receiving circuit 8 are formed. The matching device 1 is composed of the variable-capacitance diode VD, rectifier circuits LPF1 and LPF2, inductors L1 and L2, a capacitor C3, and a battery portion BAT.

The cathode terminal of the variable-capacitance diode VD is connected to a control signal line LN1 and the antenna element ANT. The anode terminal of the variable-capacitance diode VD is connected to a control signal line LN2 and the capacitor C3.

The other terminal of the control signal line LN1 is connected to the rectifier circuit LPF1 while the inductor L1 is inserted therebetween in the path. Further, in the control signal line LN1, the receiving circuit 8 is connected at the intermediate point between the cathode terminal of the variable-capacitance diode VD and the inductor L1.

The other terminal of the control signal line LN2 is connected to the rectifier circuit LPF2 while the inductor L2 and the battery portion BAT are inserted therebetween in the path.

The rectifier circuit LPF1 rectifies the pulse signal PWM1 received from the voltage supply unit 6 (FIG. 1) to generate a control voltage V1. More specifically, the rectifier circuit LPF1 is an RC low-pass filter (LPF) composed of a resistor R1 and a capacitor C1. The resistor R1 is serially inserted in the transmission line of the pulse signal PWM1, and the capacitor C1 is connected between the transmission line of the pulse signal PWM1 and a ground potential. An alternating-current component of the pulse signal PWM1 input to the rectifier circuit LPF1 is blocked by the capacitor C1, and the control voltage V1 primarily composed of a direct-current component is generated in the capacitor C1. Then the control voltage V1 generated in the rectifier circuit LPF1 is applied to the cathode terminal of the variable-capacitance diode VD through the control signal line LN1. As described above, the control voltage V1 which appears across the capacitor C1 depends on the duty ratio of the pulse signal PWM1.

The rectifier circuit LPF2 rectifies the pulse signal PWM2 received from the voltage supply unit 6 (FIG. 1) to generate a control voltage V2. The rectifier circuit LPF2 is similar to the rectifier circuit LPF1 described above, in which a resistor R2 and a capacitor C2 are disposed in place of the resistor R1 and the capacitor C1, and thus the detailed description thereof will not be repeated. The control voltage V2 generated in the rectifier circuit LPF2 is applied to the anode terminal of the variable-capacitance diode VD through the control signal line LN2.

As described above, the variable-capacitance diode VD generates a capacitance when applied with a control voltage serving as a reverse bias voltage. In other words, the variable-capacitance diode VD operates as a capacitor only when the control voltage applied to the cathode terminal is larger than the control voltage applied to the anode terminal.

The battery portion BAT is a voltage shift portion for shifting the control voltage V2 in a direction which causes the anode potential of the variable-capacitance diode VD to be negative. The battery portion BAT superimposes its battery voltage Vb on the control voltage V2. Specifically, the battery portion BAT is inserted in a direction which causes the control voltage V2 to be decreased and operates so that a voltage equivalent to (control voltage V2–battery voltage Vb) is applied to the anode terminal of the variable-capacitance diode VD. For example, the battery portion BAT is a chemical battery utilizing a chemical reaction. As a chemical battery, a dry battery (manganese dry battery, alkaline-manganese dry battery, and nickel dry battery), a primary battery such as a silver oxide battery, a mercury battery, an air-zinc battery, and a lithium battery, or a secondary battery such as a lead-acid battery, a lithium-ion battery, a nickel-hydrogen battery, a nickel-cadmium battery, and a nickel-zinc battery may be used.

Thus, since the battery portion BAT shifts the control voltage V2, a voltage to be applied to the variable-capacitance diode VD is (control voltage V2–control voltage V1–battery voltage Vb). The voltage to be applied when the battery portion BAT is not provided is (control voltage V2–control voltage V1). Thus, by arranging the battery portion BAT, the voltage to be applied to the variable-capacitance diode VD is shifted by the battery voltage Vb in the reverse bias direction (negative direction).

As described above, the voltage supply unit 6 (FIG. 1) changes the voltage to be applied to the variable-capacitance diode VD by changing the duty ratios of the pulse signals PWM1 and PWM2 in accordance with the channel selection command SEL. This provides impedance matching of the circuit including the antenna element ANT. A radio signal received by the impedance-matched antenna element ANT is output to the receiving circuit 8 through the control signal line LN1. The received radio signal is efficiently output to the receiving circuit 8 since the transmission of the radio signal to the voltage supply unit 6 is stopped by the inductors L1 and L2 inserted in the control signal lines LN1 and LN2, respectively.

The receiving circuit 8 includes a capacitor C4 and a low noise amplifier (LNA).

The capacitor C4 is serially inserted between the matching device 1 and the low-noise amplifier LNA. The capacitor C4 removes a direct-current component (offset component) contained in a radio signal output from the matching device 1 and then outputs the radio signal to the low-noise amplifier LNA.

The low-noise amplifier LNA is formed of a field effect transistor (FET) amplifier made of GaAs or the like or a high election mobility transistor (HEMT) transistor made of GaAs, for example. The low-noise amplifier LNA amplifies a high-frequency radio signal while suppressing the noise level to be relatively low. The radio signal amplified by the low-noise amplifier LNA is output as a reception signal RF.

Figure 3A:
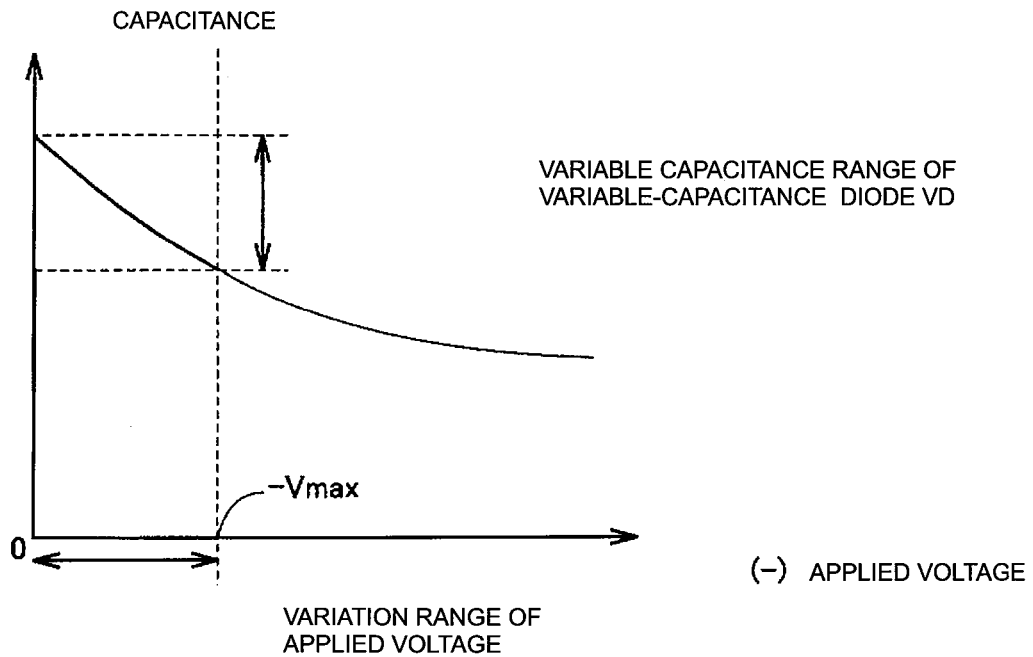
FIG. 3A is a diagram for illustrating a change in a variable capacitance range of a variable-capacitance diode due to a shift of a control voltage in a reverse bias direction where there is no voltage shift caused by a battery portion.
Figure 3B:
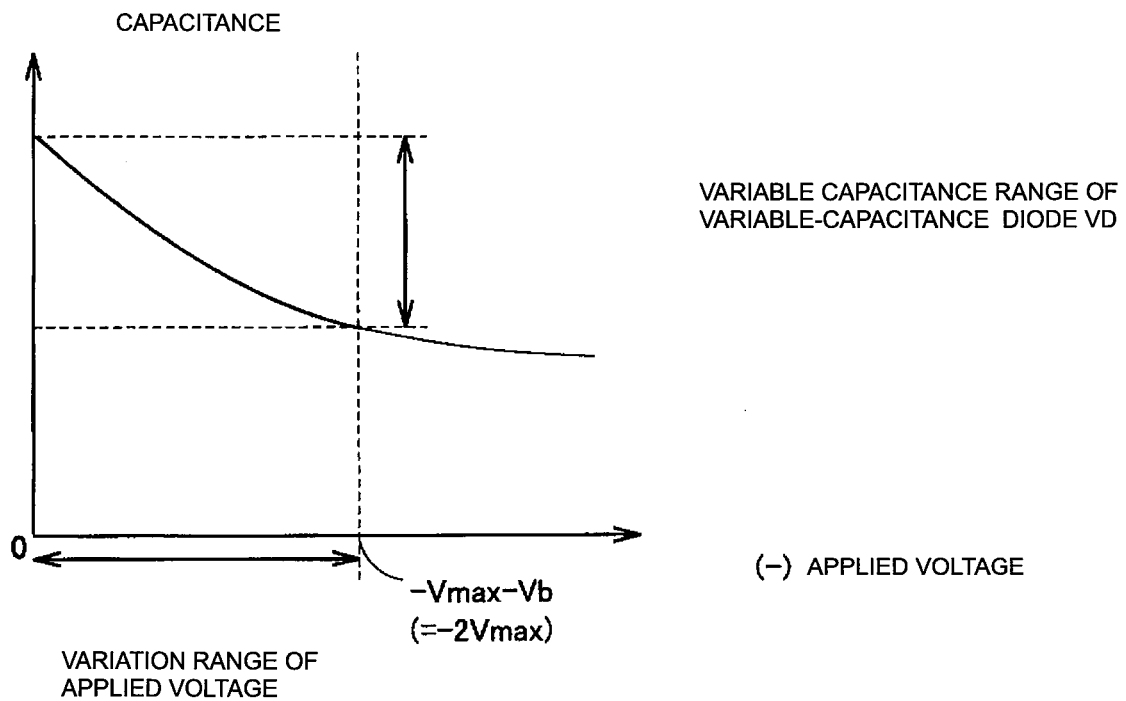
FIG. 3B is a diagram for illustrating a change in a variable capacitance range of a variable-capacitance diode due to a shift of a control voltage in a reverse bias direction where there is a voltage shift caused by a battery portion.

FIG. 3A and FIG. 3B are diagrams illustrating a change in a variable capacitance range of the variable-capacitance diode VD caused by the shift of the control voltage V2 in the reverse bias direction.

FIG. 3A illustrates a case where there is no voltage shift caused by the battery portion BAT.

FIG. 3B illustrates a case where there is a voltage shift caused by the battery portion BAT.

Referring to FIG. 3A, as described above, the variable-capacitance diode VD is a circuit element that functions as a capacitor when applied with a reverse bias voltage and, in general, is not to be applied with a forward bias voltage for operation. Specifically, the variable-capacitance diode VD generates a maximum capacitance in a state in which no control voltage is applied. Then, the capacitance of the variable-capacitance diode VD gradually decreases as a reverse bias voltage is applied.

Meanwhile, the voltage supply unit 6 (FIG. 1) generates the pulse signals PWM1 and PWM2 from the driving voltage Vcc by means of PWM modulation. Thus, the control voltages V1 and V2 applied to the variable-capacitance diode VD are each generated by a pulse signal having an amplitude ranging from 0 [V] (ground potential) to a maximum voltage Vmax [V] (>0 [V]) which is limited so as to be not higher than the driving voltage Vcc [V].

In addition, the voltage supply unit 6 can arbitrarily set the pulse signals PWM1 and PWM2. Thus, when there is no voltage shift caused by the battery portion BAT, the voltage to be applied to the variable-capacitance diode VD is variable in the range from –Vmax [V] to Vmax [V]. Specifically, when the duty ratio of the pulse signal PWM1 is 100% and the duty ratio of the pulse signal PWM2 is 50%, the control voltage V1 is equal to Vmax [V] and the control voltage V2 is equal to 0 [V]. Therefore, the voltage applied to the variable-capacitance diode VD is V2–V1=–Vmax [V]. Similarly, when the duty ratio of the pulse signal PWM1 is 0% and the duty ratio of the pulse signal PWM2 is 100%, the control voltage V1 is equal to 0 [V] and the control voltage V2 is equal to Vmax [V]. Therefore, the voltage applied to the variable-capacitance diode VD is V2–V1=Vmax [V].

However, the variable-capacitance diode VD functions as a capacitor only when applied with a reverse bias voltage, i.e., negative (−) voltage. Thus, a voltage within the variation range of −Vmax [V] to Vmax [V] which is to be substantially used as an applied voltage is limited to the range of −Vmax [V] to 0 [V]. That is, the duty ratio of the pulse signal PWM1 is not to be lower than the duty ratio of the pulse signal PWM2.

Referring to FIG. 3B, when the control voltage V2 is shifted by the battery portion BAT (battery voltage Vb), the voltage to be applied to the variable-capacitance diode VD is variable in the range from (−Vmax−Vb) [V] to (Vmax−Vb) [V]. Specifically, when the duty ratio of the pulse signal PWM1 is 100% and the duty ratio of the pulse signal PWM2 is 0%, the control voltage V1 is equal to Vmax [V], and the control voltage V2 is equal to 0 [V]. Therefore, the voltage applied to the variable-capacitance diode VD is V2−V1−Vb= (−Vmax−Vb) [V]. Similarly, when the duty ratio of the pulse signal PWM1 is 0% and the duty ratio of the pulse signal PWM2 is 100%, the control voltage V1 is equal to 0 [V] and the control voltage V2 is equal to Vmax [V]. Therefore, the voltage applied to the variable-capacitance diode VD is V2−V1−Vb=(Vmax−Vb) [V]. That is, the voltage to be applied to the variable-capacitance diode VD is substantially in the range from (Vmax−Vb) [V] to 0 [V], indicating that the range is increased by the voltage shift (battery voltage Vb).

If the battery voltage Vb is set to be equal to the maximum voltage Vmax, the voltage to be applied to the variable-capacitance diode VD is variable in the range from −2×Vmax [V] to 0 [V]. Since voltages in this variation range of the applied voltage are all reverse bias voltages to the variable-capacitance diode VD, any of the voltages in the variation range can be used as the applied voltage. That is, compared with the case where the applied voltage is limited to the range from −Vmax [V] to 0 [V] as illustrated in FIG. 3A, the variation range is increased by two times. With this increase in the variation range, the variable-capacitance range of the variable-capacitance diode VD also increases.

As described above, the battery portion BAT serving as a voltage shift portion shifts the control voltage V2 in the reverse bias direction. This substantially increases the variation range of the voltage to be applied to the variable-capacitance diode VD. This also increases the variable capacitance range of the variable-capacitance diode VD, and thus a matching device capable of performing impedance matching over an increased range can be realized.

For convenience of description, in FIG. 3B, the case where the battery voltage Vb is equal to the maximum voltage Vmax is described. However, it is not necessary to set the battery voltage Vb to be equal to the maximum voltage Vmax. Specifically, the battery voltage Vb is intended to provide a "shift voltage" to the variation range of an applied voltage. Therefore, the battery voltage Vb may be determined such that a variation range of the applied voltage corresponding to a variable capacitance range necessary for impedance matching can be obtained. At this time, when the battery voltage Vb is lower than the maximum voltage Vmax, some voltages in the variation range of the applied voltage are forward bias voltages. Although this may limit the range of voltage to be used, this limit can be suppressed to be practically ignorable.

In addition, although it is not very likely that the variable-capacitance diode VD would be applied with 0 [V] since, in general, the slope of the voltage-capacitance curve near 0 [V] is too large, the range including 0 [V] has been described for convenience of description.

According to Embodiment 1 of the present invention, for a variable-capacitance diode, a potential difference between a control voltage to be applied to the cathode terminal and a control voltage to be applied to the anode terminal is generated as an applied voltage. Therefore, by shifting the control voltage to be applied to the anode terminal in the reverse bias direction using a battery portion, the range included in a reverse bias voltage range in a variation range of voltage to be applied to the variable-capacitance diode is increased. Since this can substantially increase the variation range of the voltage to be applied to the variable-capacitance diode, the variable capacitance range of the variable-capacitance diode can also be increased. Thus, a matching device and an antenna matching circuit capable of performing impedance matching over an increased range can be realized.

EMBODIMENT 2

In Embodiment 1 described above, the case where a voltage shift portion is composed of a battery portion made of a chemical battery or the like is described. On the other hand, in Embodiment 2, a case where a voltage shift portion is composed of a constant voltage diode, which generates a constant voltage when applied with a reverse bias voltage generated from an alternating current signal supplied from a voltage supply unit, will be described.

A mobile receiver according to Embodiment 2 of the present invention is similar to the one in FIG. 1, and thus the detailed description thereof will not be repeated.

Figure 4:
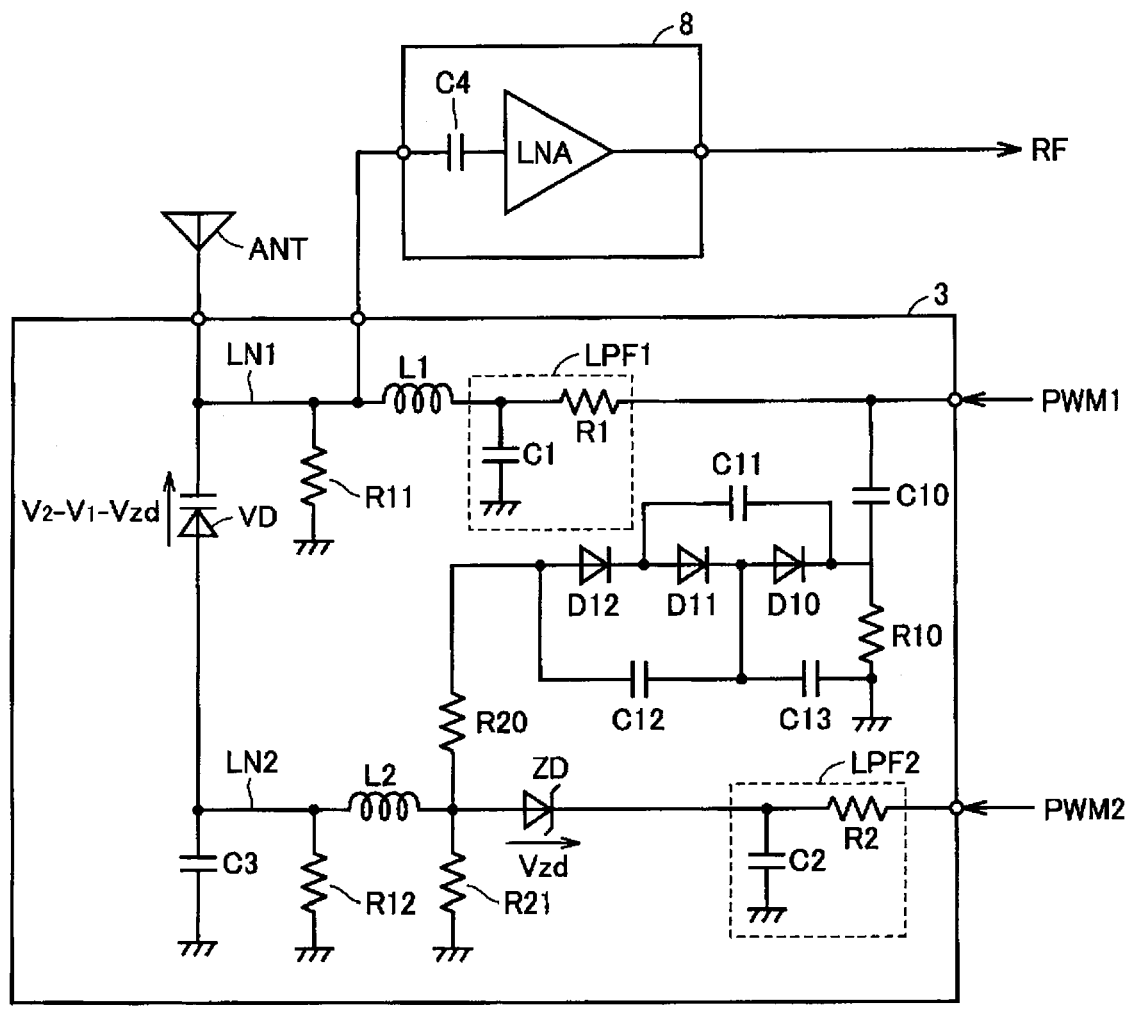
FIG. 4 is a circuit configuration diagram of a matching device, an antenna element, and a receiving circuit according to Embodiment 2 of the present invention.

Referring to FIG. 4, in a matching device 3 according to Embodiment 2 of the present invention, a Zener diode ZD, resistors R10, R20, and R21, capacitors C10, C11, C12, and C13, and diodes D10, D11, and D12 are disposed instead of the battery portion BAT in the matching device 1 according to Embodiment 1 of the present invention illustrated in FIG. 2.

The Zener diode ZD is a constant voltage diode which generates a generally constant voltage (Zener voltage Vzd) regardless of a current when applied with a reverse bias voltage higher than its breakdown voltage. The Zener diode ZD is a voltage shift portion which shifts a control voltage V2 by a Zener voltage Vzd in the direction which causes the anode potential of a variable-capacitance diode to be negative. Specifically, the Zener diode ZD is connected so as to generate the Zener voltage Vzd in the direction which causes the control voltage V2 to be decreased and operates so that (control voltage V2−Zener voltage Vzd) is applied to the variable-capacitance diode VD.

The capacitor C10 and the resistor R10 constitute a level shift circuit for blocking a direct-current component of a pulse signal PWM1 and extracting only an alternating-current component. The pulse signal PWM1 has a pulse waveform varying between 0 [V] and Vmax [V]. When this pulse signal PWM1 passes through the level shift circuit, the direct-current component is blocked, and an alternating-current pulse signal varying between −½×Vmax [V] and ½×Vmax [V] appears at the connection point between the capacitor C10 and the resistor R10.

The diodes D10, D11, and D12 and the capacitors C11, C12, and C13 constitute a voltage-multiplying rectifier which multiplies the alternating-current pulse signal which has passed through the level shift circuit by 3 and then rectifies and smoothes the pulse signal in the negative direction. Specifically, the diodes D10, D11, and D12 are connected in series, and the capacitor C11 is connected between the anode of the diode D11 and the cathode of the diode D10, the capacitor C12 is connected between the anode of the diode D12 and the cathode of the diode D11, and the capacitor C13 is connected between the anode of the diode D10 and a ground potential. The output negative direct-current voltage which has been rectified and smoothed after being multiplied by 3 is output to the anode terminal of the diode D12. The detailed description of circuit operation of the voltage-multiplying rectifier circuit will not be repeated since it is a technique which is known to persons skilled in the art.

The output negative direct-current voltage which has been rectified and smoothed after being multiplied by 3 and appears at the anode terminal of the diode D12 is divided in accordance with the resistance ratio of the resistors R20 and R21 and applied to the anode terminal of the Zener diode ZD. The values of the resistors R20 and R21 are set as necessary.

The matching device 3 is further provided with a resistor R11 connected between a control signal line LN1 and the ground potential and a resistor R12 connected between a control signal line LN2 and the ground potential. The resistors R11 and R12 supplies a very small amount of current to the ground potential through the control signal lines LN1 and LN2, respectively, so as to stabilize a control voltage to be applied to the variable-capacitance diode VD.

The other features are similar to those of the matching device 1 described above, and thus the detailed descriptions thereof will not be repeated. In addition, for the antenna element ANT and the receiving circuit 8, detailed descriptions will not be repeated since they are similar to those of Embodiment 1 of the present invention illustrated in FIG. 2.

As described above, in Embodiment 2 of the present invention, the Zener diode ZD shifts the control voltage V2. Thus, the voltage to be applied to the variable-capacitance diode VD is (control voltage V2−control voltage V1−Zener voltage Vzd), and thus the voltage to be applied to the variable-capacitance diode VD is shifted by the Zener voltage Vzd in the reverse bias direction (negative direction). Therefore, for the same reason as described in FIG. 3, a variation range of the voltage to be applied to the variable-capacitance diode VD can be substantially increased. Since this also increases the variable capacitance range of the variable-capacitance diode VD, a matching device capable of performing impedance matching over an increased range can be realized.

Note that in Embodiment 2 described above, the configuration for generating a constant voltage by applying a reverse bias voltage using the pulse signal PWM1 is described. However, needless to say, a constant voltage can similarly be generated by using the pulse signal PWM2.

In addition, since the Zener voltage Vzd is determined by a structure or a material of the Zener diode ZD, a plurality of Zener diodes ZD can be disposed in series when a larger shift voltage is required.

According to Embodiment 2 of the present invention, for a variable-capacitance diode, a potential difference between a control voltage to be applied to the cathode terminal and a control voltage to be applied to the anode terminal is generated as an applied voltage. Therefore, by shifting the control voltage to be applied to the anode terminal in the reverse bias direction using a Zener diode, the range included in a reverse bias voltage range in a variation range of voltage to be applied to the variable-capacitance diode is increased. Since this can substantially increase the variation range of the voltage applied to the variable-capacitance diode, the variable capacitance range of the variable-capacitance diode can also be increased. Accordingly, a matching device and an antenna matching circuit capable of performing impedance matching over an increased range can be realized.

In addition, according to Embodiment 2 of the present invention, when an alternating-current signal for applying a voltage to the variable-capacitance diode is provided, the Zener diode ZD functions as a constant voltage diode in accordance with the alternating-current voltage. Thus, it is possible to automatically shift the voltage for a required time period. Since this can suppress unnecessary power consumption during a non-operation period in which the receiving circuit does not receive a radio signal, reduction of power consumption can also be achieved.

EMBODIMENT 3

In Embodiment 1 or 2 described above, a case in which a voltage shift is performed by superimposing a voltage on a direct-current control signal generated from an alternating-current signal is described. On the other hand, in Embodiment 3, a configuration for shifting a control voltage by processing an alternating-current signal supplied from a voltage supply unit will be described.

A mobile receiver according to Embodiment 3 of the present invention is similar to the one in FIG. 1, and thus the detailed description thereof will not be repeated.

Figure 5:
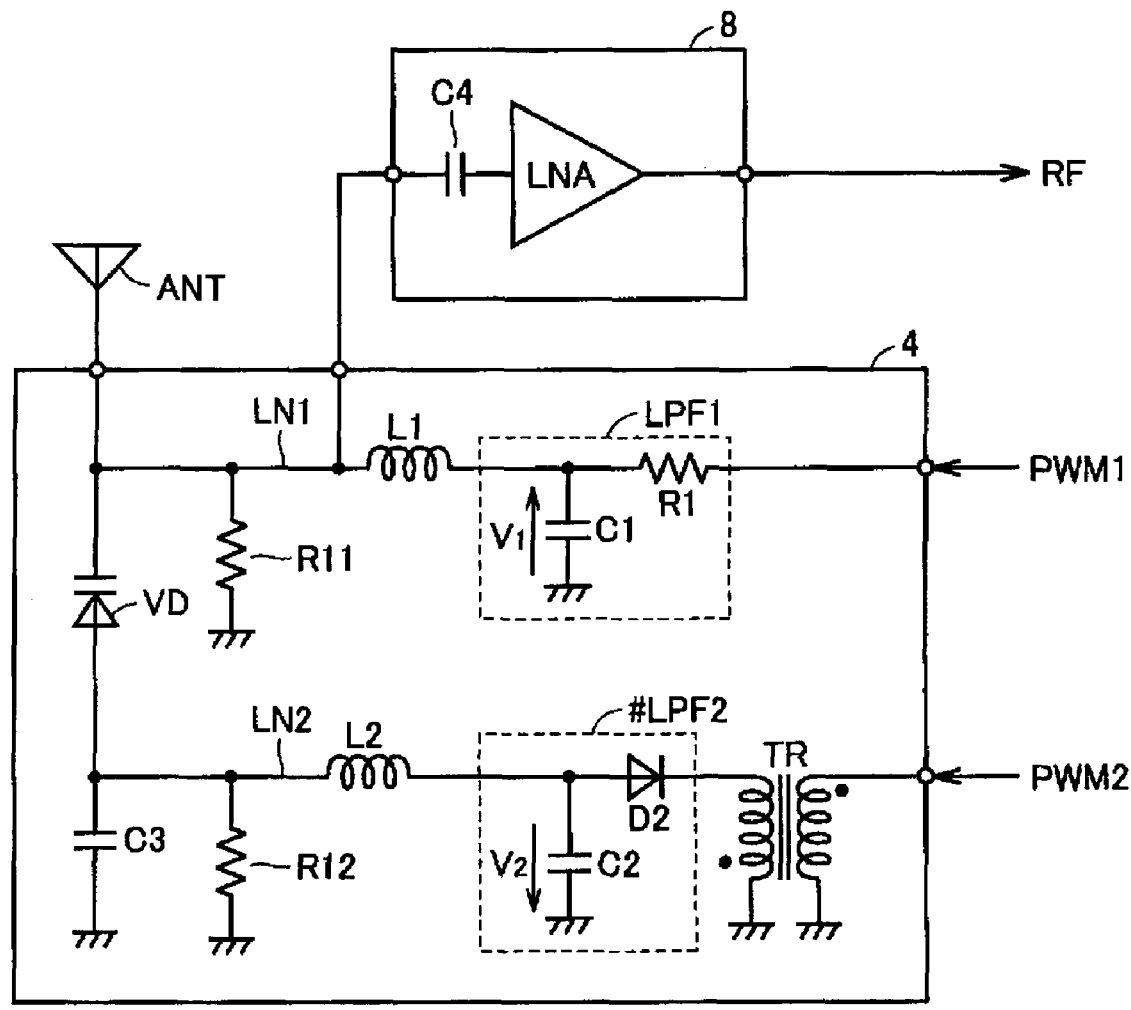
FIG. 5 is a circuit configuration diagram of a matching device, an antenna element, and a receiving circuit according to Embodiment 3 of the present invention.

Referring to FIG. 5, in a matching device 4 according to Embodiment 3 of the present invention, a transformer TR and resistors R11 and R12 are disposed instead of the battery portion BAT in the matching device 1 according to Embodiment 1 of the present invention illustrated in FIG. 2. In addition, a rectifier circuit #LPF2 is disposed in place of the rectifier circuit LPF2.

The transformer TR is inserted between a connection part for receiving a pulse signal PWM2 from the voltage supply unit 6 (FIG. 1) and the rectifier circuit #LPF2. Specifically, a pulse signal PWM1 is input to a primary winding of the transformer TR and output from a secondary winding is supplied to the rectifier circuit #LPF2. The primary winding and the secondary winding of the transformer TR are configured to have opposite polarities. The pulse signal PWM2 input to the primary winding is polarity-inverted and output from the secondary winding.

In the rectifier circuit #LPF2, a diode D2 is disposed in place of the resistor R2 in the rectifier circuit LPF2 shown in FIG. 2. The rectifier circuit #LPF2 passes and rectifies only a negative voltage component in a polarity-inverted alternating-current signal output from the transformer TR so as to generate a control voltage V2 composed of a negative direct-current component.

Therefore, when the turns ratio between the primary winding and the secondary winding (transformation ratio) of the primary winding and the secondary winding is 1, the control voltage V2 output from the rectifier circuit #LPF2 is in the range from −Vmax [V] to 0 [V]. This indicates that the variation range of the control voltage V2 is shifted by a maximum voltage Vmax [V] in the reverse bias direction, compared with the variation range of 0 [V] to Vmax [V] of the control signal V2 output from the rectifier circuit LPF2 in Embodiments 1 to 2 described above.

Specifically, when the duty ratio of the pulse signal PWM1 is 0% and the duty ratio of the pulse signal PWM2 is 0%, the control voltage V1 is equal to 0 [V] and the control voltage V2 is equal to 0 [V]. Therefore, the voltage applied to the variable-capacitance diode VD is V2−V1=0 [V]. In addition, when the duty ratio of the pulse signal PWM1 is 100% and the duty ratio of the pulse signal PWM2 is 100%, the control voltage V1 is equal to Vmax [V] and the control voltage V2 is equal to −Vmax [V]. Therefore, the voltage applied to the variable-capacitance diode VD is V2−V1=−2×Vmax [V].

The matching device 4 is further provided with the resistor R11 connected between a control signal line LN1 and a ground potential and the resistor R12 connected between a control signal line LN2 and the ground potential. The resistors R11 and R12 supply a very small amount of current to the ground potential through the control signal lines LN1 and LN2, respectively, so as to stabilize a control voltage to be applied to the variable-capacitance diode VD.

The other features are similar to those of the matching device 1 described above, and thus detailed descriptions thereof will not be repeated. In addition, for the antenna element ANT and the receiving circuit 8, detailed descriptions will not be repeated since they are similar to those of Embodiment 1 of the present invention illustrated in FIG. 2.

As described above, in Embodiment 3 of the present invention, the polarity of the control voltage V2 is inverted by the transformer TR. Thus, the voltage to be applied to the variable-capacitance diode VD is shifted by an absolute value of the control voltage V2 in the reverse bias direction (negative direction). Therefore, for the same reasons described in FIG. 3, the variation range of the voltage which can be applied to the variable-capacitance diode VD can be substantially increased. Therefore, the variable capacitance range of the variable-capacitance diode VD can also be increased, and thus a matching device capable of performing impedance matching over an increased range can be realized.

Note that the variation range of the control voltage V2 may be increased or decreased by using a turns ratio of the transformer TR which is other than 1. That is, an increase or decrease in the variation range of the applied voltage is possible in addition to the voltage shift of the control voltage V2. Therefore, it is also possible to freely set the voltage to be applied to the variable-capacitance diode VD in accordance with a required variable capacitance range of the variable-capacitance diode VD.

According to Embodiment 3 of the present invention, for a variable-capacitance diode, a potential difference between a control voltage to be applied to the cathode terminal and a control voltage to be applied to the anode terminal is generated as an applied voltage. Therefore, by shifting the control voltage to be applied to the anode terminal in the reverse bias direction using a transformer, the range included in a reverse bias voltage range in a variation range of voltage to be applied to the variable-capacitance diode is increased. Since this can substantially increase the variation range of the voltage to be applied to the variable-capacitance diode, the variable capacitance range of the variable-capacitance diode can also be increased. Thus, a matching device and an antenna matching circuit capable of performing impedance matching over an increased range can be realized.

Moreover, according to Embodiment 3 of the present invention, in addition to the voltage shift, an increase or decrease in the variation range of an applied voltage is possible by changing the turns ratio of the transformer. Therefore, the variable capacitance range of the variable-capacitance diode VD can further be increased.

In each of Embodiments 1 to 3 of the present invention, a case where pulse signals PWM1 and PWM2 generated by PWM modulation are used is illustrated as an example. However, the scheme for generating or modulating an alternating-current signal is not limited to the above example. For example, an alternating-current signal may be generated using pulse frequency modulation (PFM). Further, instead of the configuration in which pulse signals PWM1 and PWM2 are rectified by the rectifier circuits LPF1 and LPF2, respectively, it may be configured such that a direct-current control voltage based on a digital command (digit value) is directly generated using a digital to analog converter (DAC).

The embodiments disclosed above are to be considered in all respects as illustrative and not restrictive. The scope of the present invention is indicated by the claims rather than by the foregoing description, and all modifications which come within the meaning and range of equivalency of the claims are therefore intended to be embraced therein.

Although particular embodiments have been described, many other variations and modifications and other uses will become apparent to those skilled in the art. Therefore, the present invention is not limited by the specific disclosure herein.

What is claimed is:

1. A matching device comprising:
   a variable-capacitance diode configured to change an impedance of a circuit including an external element;
   a first control signal line for applying a first control voltage, the first control signal line being connected to a cathode terminal of the variable-capacitance diode;
   a second control signal line for applying a second control voltage, the second control signal line being connected to an anode terminal of the variable-capacitance diode; and
   a voltage shift portion inserted in the second control signal line, the voltage shift portion shifting the second control voltage so that the anode potential of the variable-capacitance diode becomes a negative potential.

2. The matching device according to claim 1, wherein the voltage shift portion comprises a chemical battery.

3. The matching device according to claim 1, further comprising:
   a first rectifier circuit connected to the first control signal line, the first rectifier circuit rectifying a first alternating-current signal to generate the first control voltage supplied to the first control signal line; and
   a second rectifier circuit connected to the second control signal line, the second rectifier circuit rectifying a second alternating-current signal to generate the second control voltage supplied to the second control signal line.

4. The matching device according to claim 3,
   wherein the voltage shift portion comprises a constant voltage diode which generates a constant voltage when applied with a reverse bias voltage, and
   a bias supply circuit for supplying the constant voltage diode with the reverse bias voltage derived from the first alternating-current signal or the second alternating-current signal.

5. The matching device according to claim 4, wherein said bias supply circuit comprises a level shift circuit and a voltage-multiplying rectifier circuit for deriving the reverse bias voltage from the first alternating-current signal or the second alternating-current signal.

6. The matching device according to claim 5, wherein said reverse bias voltage is derived from the first alternating-current signal.

7. The matching device according to claim 5, wherein said bias supply circuit is connected to the anode of the constant voltage diode via a voltage divider.

8. The matching device according to claim 3,
   wherein the voltage shift portion comprises a transformer configured to supply the second alternating-current signal to the second rectifier circuit after inverting the polarity of the second alternating-current signal.

9. The matching device according to claim 3,
   wherein the first and second alternating-current signals are pulse width modulation signals.

10. The matching device according to claim 1, further comprising a pair of stabilizing resistors connected respectively to said anode and cathode terminals of said variable-capacitor diode for stabilizing said first and second control voltages.

* * * * *